United States Patent
Taylor

(10) Patent No.: US 6,870,207 B2
(45) Date of Patent: Mar. 22, 2005

(54) III-V CHARGE COUPLED DEVICE SUITABLE FOR VISIBLE, NEAR AND FAR INFRA-RED DETECTION

(75) Inventor: Geoff W Taylor, Glastonbury, CT (US)

(73) Assignee: The University of Connecticut, Farmington, CT (US)

(*) Notice: Subject to any disclaimer, the term of this patent is extended or adjusted under 35 U.S.C. 154(b) by 0 days.

(21) Appl. No.: 09/556,285

(22) Filed: Apr. 24, 2000

(65) Prior Publication Data

US 2003/0020099 A1 Jan. 30, 2003

(51) Int. Cl.$^7$ .............................................. H01L 29/765
(52) U.S. Cl. ...................... 257/217; 257/24; 257/183.1; 257/623
(58) Field of Search .......................... 257/14, 24, 183.1, 257/217

(56) References Cited

U.S. PATENT DOCUMENTS

| | | | |
|---|---|---|---|
| 4,229,752 A | 10/1980 | Hynecek | 357/24 |
| 4,424,525 A * | 1/1984 | Mimura | 257/217 |
| 4,584,697 A | 4/1986 | Hazendonk et al. | 377/60 |
| 4,683,484 A * | 7/1987 | Derkits | 257/183.1 |
| 4,806,997 A | 2/1989 | Simmons et al. | 357/16 |
| 4,827,320 A | 5/1989 | Morkoc et al. | 357/22 |
| 4,899,200 A | 2/1990 | Shur et al. | 357/30 |
| 4,949,350 A | 8/1990 | Jewell et al. | 372/45 |
| 4,995,061 A | 2/1991 | Hynecek | 377/58 |
| 5,010,374 A | 4/1991 | Cooke et al. | 357/16 |

(List continued on next page.)

OTHER PUBLICATIONS

Gunapala et al., "Quantum Well Infrared Photodetector (QWIP) Focal Plane Arrays," Semiconductors and Semimetals series, vol. 62, 1999.

Song et al., "A Resistive-Gate $Al_{0.3}Ga_{0.7}As$/GaAs 2DEG CCD with High Charge-Transfer Efficiency at 1 GHz," IEEE Trans. On Elec. Dev., vol. 38, No. 4, Apr. 1991, pp. 930–932.

Bakker et al., "The Tacking CCD: A New CCD Concept," IEEE Trans. On Elec. Dev., vol. 38, No. 5, May 1991, pp. 1193–1200.

(List continued on next page.)

*Primary Examiner*—Gene M. Munson
(74) *Attorney, Agent, or Firm*—Gordon & Jacobson, PC

(57) ABSTRACT

A photon detector is obtained by using the intersubband absorption mechanism in a modulation doped quantum well(s). The modulation doping creates a very high electric field in the well which enables absorption of input TE polarized light and also conducts the carriers emitted from the well into the modulation doped layer from where they may recombine with carriers from the gate contact. Carriers are resupplied to the well by the generation of electrons across the energy gap of the quantum well material. The absorption is enhanced by the use of a resonant cavity in which the quantum well(s) are placed. The absorption and emission from the well creates a deficiency of charge in the quantum well proportional to the intensity of the input photon signal. The quantity of charge in the quantum well of each detector is converted to an output voltage by transferring the charge to the gate of an output amplifier. The detectors are arranged in the form of a 2D array with an output amplifier associated with the entire array or a row of the array as in the known charge coupled devices, or a separate amplifier could be dedicated to each pixel as in the known architecture of the active pixel device. This detector has the unique advantage of near room temperature operation because the dark current is limited to the generation across the semiconductor bandgap and not the emission over the quantum well barrier. The detector also has the advantage that the readout circuitry is implemented monolithically by the HFETs formed in the GaAs substrate simultaneously, with the detecting elements.

26 Claims, 4 Drawing Sheets

U.S. PATENT DOCUMENTS

| | | | |
|---|---|---|---|
| 5,105,248 A | * 4/1992 | Burke et al. | 257/183.1 |
| 5,202,896 A | 4/1993 | Taylor | 372/50 |
| 5,386,128 A | * 1/1995 | Fossum et al. | 257/183.1 |
| 5,422,501 A | 6/1995 | Bayraktaroglu | 257/195 |
| 5,517,244 A | 5/1996 | Stekelenburg et al. | 348/305 |
| 5,698,900 A | 12/1997 | Bozada et al. | 257/744 |
| 6,031,243 A | 2/2000 | Taylor | 257/13 |
| 6,351,001 B1 | 2/2002 | Stevens et al. | 257/223 |

OTHER PUBLICATIONS

Ula et al., "Simulation, Design, and Fabrication of Thin–Film Resistive–gate GaAs Charge Coupled Devices," IEEE Electron Devices Meeting, 1990. Technical Digest International, Dec. 1990, pp. 271–274.

Davidson et al., "GaAs charge–coupled devices," Can. J. Phys., vol. 67, 1989, pp. 225–231.

Song et al., "Characterization of Evaporated Cr–SiO Cermet Films for Resistive–Gate CCD Applications," IEEE Trans. On Elec. Dev., vol. 36, No. 9, Sep. 1989, pp. 1575–1579.

LeNoble et al., "A Two–Phase GaAs Cermet Gate Charge–Coupled Device," IEEE Trans. On Elec. Dev., vol. 37, No. 8, Aug. 1990, pp. 1796–1799.

Beggs et al., "Optical charge injection into a gallium arsenide acoustic charge transport device," J. Appl. Phys., vol. 63, No. 7, Apr. 1988, pp. 2425–2430.

Ablassmeier et al., "Three–Phase GaAs Schottky–Barrier CCD Operated up to 100–MHz Clock Frequency," IEEE Trans. On Elec. Dev., vol. 27, No. 6, Jun. 1980, pp. 1181–1183.

LeNoble et al., "Uniphase operation of a GaAs resistive gate charge–coupled device," Can. J. Phys. vol. 70, 1992, pp. 1143–1147.

LeNoble et al., "Two–phase GaAs cermet–gate charge–coupled devices," Can. J. Phys., vol. 69, 1991, pp. 224–227.

Ula et al., "Optimization of Thin–Film Resistive–Gate and Capacitive–Gate GaAs Charge–Coupled Devices," IEEE Trans. On Elec. Dev., vol. 39, No. 5, May 1992, pp. 1032–1040.

LeNoble et al., "The Surface Potential Variation in the Interference Gaps of GaAs Cermet–Gate Charge–Coupled Devices," Solid–State Electronics, vol. 33, No. 7, 1990, pp. 851–857.

Albert J. P. Theuwissen, "Solid–State Imaging with Charge–Coupled Devices," Kluwer Academic Publishers, Mar. 1995, pp. 54–63.

P.A. Kiley et al., *Submicrometre Gate Length Scaling of Inversion Channel Heterojunction Field Effect Transistor*, Electronic Letters Mar. 17, 1994, vol. 30, No. 6, pp. 529–531.

G.W. Taylor and P.A. Kiely, *Theoretical and Experimental Results for the Inversion Channel Heterostructure Field Effect Transistor*, IEE Proceedings–G, vol. 140, No. 6, Dec. 1993.

S.V. Bandara et al., *Broad–band GaAs/AlxGa1–xAs QWIPS*, NASA Tech Brief vol. 23, No. 4 (from JPL New Technology Report NPO–20319), Apr. 1999.

Lee H., Wicks G. & Eastman L.F., *High Temperature Annealing of Modulation Doped GaAs/AlGaAs Heterostructures for FET Applications*, IEEE/Cornell Conf. on High Speed Semiconductor Devices & Ckts, 8/83, pp. 204–208.

Taylor G. & Simmons J., *Heterojunction Field–Effect Transistor (HFET)*, Electronics Letters, Jul. 17, 1986, vol. 22, No. 15, pp. 784–786.

* cited by examiner

III-V CHARGE COUPLED DEVICE SUITABLE FOR VISIBLE, NEAR AND FAR INFRA-RED DETECTION

TECHNICAL FIELD OF THE INVENTION

This invention relates to the field of charge coupled and active pixel image sensors that are fabricated in the III–V material systems and have sensitivities over a broad spectral range including the UV, visible, near and far infrared regions.

BACKGROUND OF INVENTION

Next generation imaging systems are required to have Charged Coupled Devices (CCD's) that operate at very high frequencies and to have a high resistance to radiation flux (the imager is said to be radiation hardened). Many of these applications are in space where radiation flux is significant and reliability is critical. State-of-the-art imagers are constructed as Si integrated circuits in the form of CCD's or active pixel arrays. In the CCD, the pixels are clocked sequentially to a common output amplifier. In the active pixel array, the array is x-y addressable and each pixel is output to its own dedicated amplifier (the array is output on a row by row or column by column basis).

Si technology is limited by the presence of the silicon oxide in both the active and passive regions of the integrated circuit in a number of ways. A main limitation is the sensitivity of the oxide to radiation flux. The radiation creates traps and other charged defects in the insulator which alter the internal voltage thresholds in both active and passive regions within the integrated circuit. After a certain cumulative exposure level, these threshold changes render the circuit inoperable. The gate oxide creates limitations in other ways as well. The Si CCD couples one pixel to the other via overlapping gates. Each overlapping gate creates a small region of thicker oxide between pixels which inhibits charge transfer and therefore sets a speed limitation upon the CCD. These oxide barriers are fundamental to the Si CCD and constitute a transfer speed limitation. Some approaches have been employed to eliminate these effects such as the virtual phase CCD. However, these structures are then faced with barriers created by implant misalignment and a lack of well capacity. In any event the transfer speed in the Si CCD rarely exceeds a few MHz.

A further limitation of the Si CCD is its spectral sensitivity. The Si CCD absorbs radiation across its energy gap and therefore is insensitive to radiation with a wavelength longer than about 1 um. It is also insensitive to UV radiation.

III–V device structures based upon GaAs substrates have the potential to overcome the above limitations. In particular, the GaAs CCD has the potential to absorb within a quantum well between the various subbands. This provides the GaAs device with unique capabilities of intersubband absorption and sensitivity in the mid wavelength infrared, long wavelength infrared and very long wavelength infrared regions. The GaAs device structures that currently perform the intersubband detector functions are the QWIP (quantum well infrared photodetector) devices. Two significant limitations of the QWIP as currently implemented are the existence of a significant level of dark current that necessitates cooling of the device to 77K and the fact that the device is not compatible with GaAs integrated circuits. When originally demonstrated the QWIP was considered advantageous because of its potential compatibility with GaAs integrated circuits. However, this compatibility has never been established and so present technology combines the GaAs QWIP wafer in a hybrid fashion with a Si read-out integrated circuit. There have been several efforts to build CCD shift registers using the basic transistor structures of the MESFET and HEMT devices. These technologies have always been plagued by the problem of low transfer efficiencies between pixels in the array. The proposed solutions have been to utilize a resistive coupling between pixels, which would provide drift aided transfer. The problem has been that no viable technique to implement resistive coupling has been found. The use of deposited resistive layers was attempted but the resistive control problems discouraged further investigations.

It is an object of this invention to provide a CCD technology in a III–V semiconductor system which is capable of very high transfer rates, substantially improved maximum charge compared to Si technology, and substantially improved radiation hardness properties compared to Si technology. This CCD technology will implement the resistive coupling structure in a natural way via the crystal growth which optimizes the charge transfer efficiency.

It is another object of this invention to provide a CCD technology which may absorb radiation in the broad range from 3 um–20 um via the intersubband absorption mechanism and convert the radiation to packets of charge for transfer to the CCD output amplifiers It is another object of this invention to provide a CCD technology which has optical sensitivity in the uv, visible and near IR portions of the electromagnetic spectrum It is another object of this invention to implement the CCD in an integrated fashion together with HFET technology such that analog to digital conversions can be made on the data.

It is another object of this invention to implement the CCD as part of a monolithic optoelectronic integrated circuit such that a vertical cavity surface emitting laser is available at the output amplifier of the CCD to facilitate the coupling of digital data from the chip into an optical fiber for transmission.

It is a final object of this invention to implement an active pixel within a III–V optoelectronic technology which is sensitive by bandgap absorption in the uv, visible, and near IR portions of the spectrum and sensitive by intersubband absorption in the MWIR and LWIR.

SUMMARY OF THE INVENTION

A CCD epitaxial growth structure and fabrication technology have been invented which utilize a modulation doped interface to create an inversion channel for the storage of charge packets. The charge transfer is facilitated by the unique features of the epitaxial growth which include two delta-doped sheets of p type doping. One p type sheet is very close to the inversion channel and enables a resistive coupling between adjacent wells through a very thin sheet of highly doped material. The resistive coupling enables a high field and optimized drift velocity between pixels during the transfer phase which is responsible for the very high transfer rate. The second charge sheet positioned at the wafer surface enables a very low resistance ohmic contact to the gate metal contact. It is this ohmic contact that enables the HFET, which is the fundamental field effect device in the technology.

The inversion channel is comprised of 2 or 3 quantum wells and these quantum wells may absorb incident radiation in the MWIR and LWIR regions. The CCD is unique because the absorption of radiation is used to empty the quantum well and the charge leaving the well, flows as recombination current to the gate ohmic contact. Therefore for the sensing of signals by the intersubband absorption mechanism in this invention, the imaged signal is formed as the depletion of an initially full well of charge and this depleted condition is clocked to the output node. On the other hand, the CCD may also image signals in the UV, the visible and the near IR regions of the spectrum by conventional band gap absorption.

The device is described in the embodiment of the inversion channel technology which is a generalized approach to the implementation of optoelectronic devices as integrated components based upon the use of modulation doped structures. As such, the embodiment enables lasers and optical switches as well as the CCD to be implemented. In this description of the invention, a refractory emitter or gate metal contact is used for the transfer portion of the pixel. Also, dielectrics are used above the gate to form ¼ wavelength pairs for the imaging portion of the pixel. These dielectrics, when taken together with an epitaxially grown mirror below the active device structure constitute a resonant cavity at the wavelength of interest in the LWIR or MWIR regions. In the described embodiment, ion implants are used for several purposes. The N type implant is used to form source and drain regions to the inversion channel, and it is also used to shift the threshold voltage of the inversion channel interface. The epitaxial structure is grown as a normally off (enhancement) device and then the N type implant is used to create regions of normally on (depletion) devices and it is these regions where the charge packets are stored. Oxygen implants may also be used to create high resistance regions below the implants. The technology utilizes the oxidation of AlAs and other layers with large aluminum percentages to achieve passivation, isolation and dielectric mirrors below the structure.

The basic structure of the pixel and the output amplifiers which are employed in the CCD may also be used to design an active pixel sensor. In such a design, each pixel is interfaced to an output amplifier and a row or a column is output in parallel.

DESCRIPTION OF THE PREFERRED EMBODIMENTS

Figure 1:
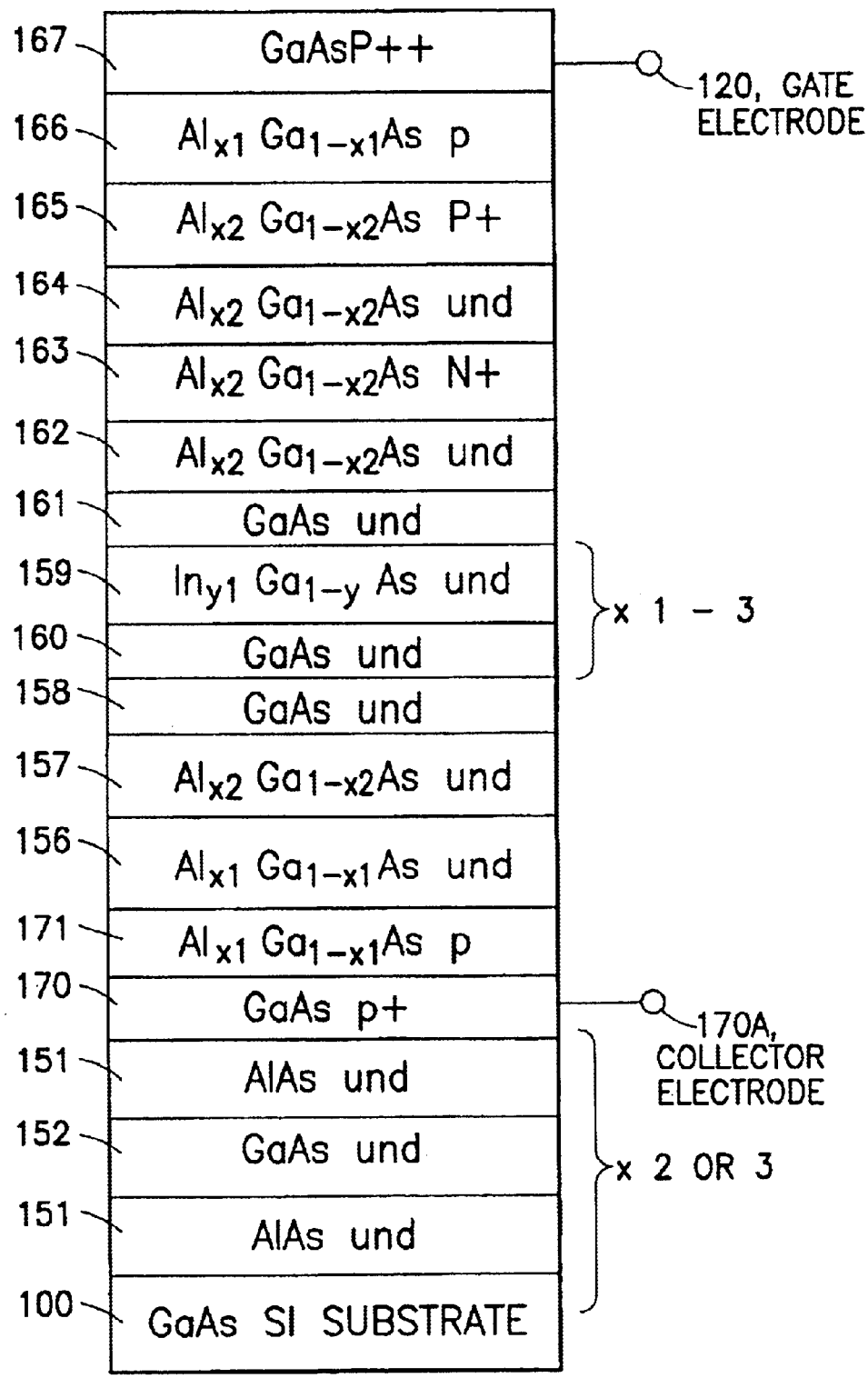
FIG. 1 is a schematic view of the epitaxial layer structure indicating the modulation doped interface, the delta-doped resistively coupled layer and the delta-doped p contact layer

FIG. 1 shows the epitaxial layer structure corresponding to the preferred embodiment and from which the CCD, the active pixel and the HFET (heterostructure field effect transistor) can be made. The layer structure starts from a semi-insulating GaAs substrate 100 and grows a DBR (distributed Bragg reflector) mirror stack of 1–3 pairs of ¼ wavelength mirror using combinations of GaAs as layer 152 and AlAs as layers 151 which are subsequently oxidized to produce layers of AlxOy positioned between layers of GaAs. These layers form a bottom mirror for a cavity which is resonant at the intersubband wavelength of interest. Only a few pairs are used (1–3) to create a modest resonance in order to limit the total layer thickness and therefore epitaxial growth time. Following the DBR growth, a layer 170 of p+ GaAs of about 0.5 μm is grown to enable a bottom ohmic contact to the collector. Then a layer 171 of $Al_{x1}Ga_{y1}As$ (0.4<x1<1), and where y1=1−x1) is grown to a thickness of about 1000–2000 Å to assist in the contact formation with a p type doping of about $10^{18}$ cm$^{-3}$ and is followed by another layer 156 of undoped $Al_{x1}Ga_{y1}As$ of about 1000–3000 Å to provide carrier confinement. This is followed by layer 157 of undoped $Al_{x2}Ga_{y2}As$ (0.1<x2<0.3) and then a separation layer 158 of undoped GaAs. Layer 158 enables a growth interruption to lower the growth temperature for growing the quantum well(s). Layers 157 and 158 isolate the quantum wells from the carrier confinement layers 156. Next the undoped quantum well 160 and undoped barrier layer 159 are grown as a pair and there may be one to three pairs. The quantum well has been designed for intersubband absorption. A thin layer 161 of undoped GaAs of about 30 Å is then grown as a spacer which enables a growth temperature change between the InGaAs well and the layers above the well(s). The GaAs spacer is followed by an undoped spacer layer 162 of about 30 Å of $Al_{x2}Ga_{y2}As$. Then the modulation doped layer 163 of N+ type doped $Al_{x2}Ga_{y2}As$ (wherein y2=1−x2) is grown with a thickness of 40–100 Å to contain an ion density of $10^{12}$ cm$^{-2}$<Q<4×$10^{12}$ cm$^{-2}$. On top of the modulation doped layer is grown an undoped capacitor spacer layer 164 of 100–300 Å thickness which can be as thin as possible consistent with the growth and fabrication. On top of the capacitor layer is grown a P+ doped layer 165 which serves as the charge source layer for the gate. This layer should be as thin as possible and as highly doped as possible providing that it remains only partially depleted under all conditions of operation, i.e. a portion of this layer, however small, always remains undepleted. Above the charge source layer is grown a cladding layer 166 of thickness 500 Å<z<2000 Å, of doping in the range of $10^{17}$ cm$^{-3}$ and of composition $Al_{x1}Ga_{y1}As$. This layer serves to block minority carrier injection into the gate. The final layer 167 is a GaAs layer of about 100 Å or thinner and with P++ type doping which enables the formation of a very low resistance ohmic contact for hole carriers to the gate electrode 120.

Figure 2:
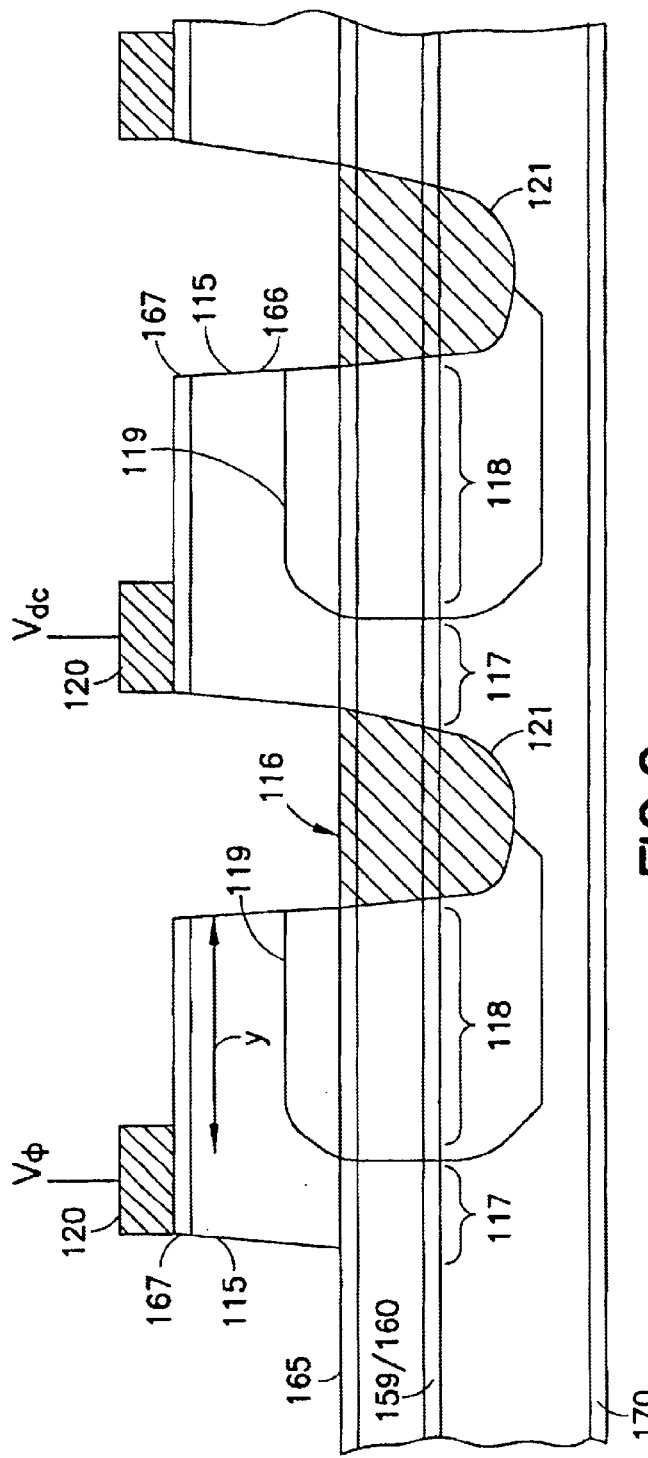
FIG. 2 is a fabricated device cross-section of the CCD pixels including the pixel storage region, the pixel blocking region and the inter-pixel transfer region.
Figure 2A:
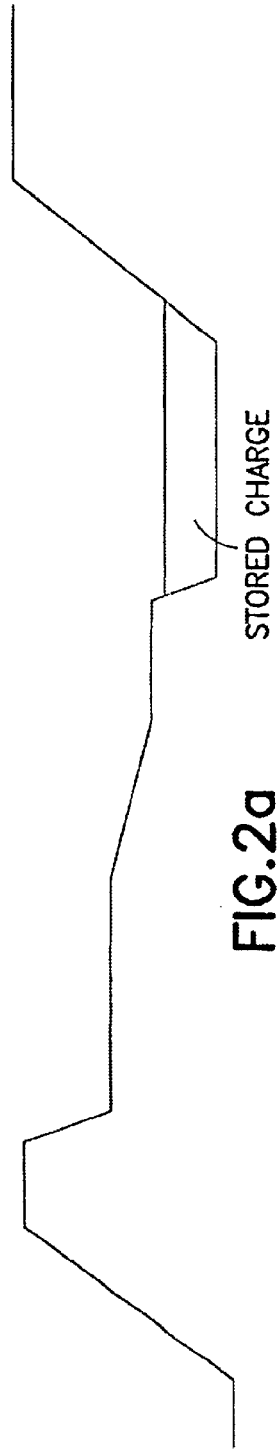
FIG. 2a is the potential profile of the device of FIG. 2.

The CCD is formed as a series of mesas 115 in FIG. 2 and referred to as pixels, seperated by regions 116 referred to as the inter-electrode transfer regions in FIG. 2. The mesas are created by patterning the original wafer (with photoresist for example) and then etching (typically by reactive ion etching for accuracy) to the charge source layer 165. Between the electrodes, an ion implant 121 is positioned so that the storage region 118 and the adjacent barrier region 117 of the next mesa are connected by a high conductivity region. This implant 121 is simultaneously used to form the source and drain regions of all transistors in the integrated circuit. Thus each storage region is connected to the next barrier region by a source implant. These inter-electrode regions are designed to maximize the drift current from pixel to pixel during charge transfer. Suppose that the voltage difference between clock phases is 2V and it is desired to achieve the maximum channel velocity corresponding to $E=5\times10^3$ V/cm. Then an inter-electrode region width of 4 µm would be desirable. The pixels are divided into a barrier region 117 and a storage region 118. The barrier region is contacted by the metal gate electrode 120 which is formed from a refractory metal such as tungsten or a tungsten alloy and produces an ohmic contact with the topmost GaAs layer 167. The gate electrode is formed upon the as-grown epitaxial material which has an enhancement threshold meaning that it is in the off condition with zero gate voltage. The storage region is adjacent to the barrier region and is defined with an ion implant 119 of N type species into the active layer. Therefore, the region of the mesa without the implant, defines the barrier region. The purpose of the implant is to move the threshold of the interface to a normally on condition so that the potential profile under the gate electrode appears as shown in FIG. 2*a*. The metal emitter (gate electrode 120) is patterned to be approximately positioned over the barrier portion and to be equal to or greater than the barrier length. It is self-aligned to the left edge of the mesa. However, the P++ GaAs layer 167 is low enough in resistance to force the entire surface of the mesa to be at the potential of the metal electrode for all the current densities of interest in the operation. The storage section of the pixel is therefore at a constant potential along its length y in FIG. 2 and this means the storage section is an equipotential region. The operation of this CCD is 1½ phase which means that alternate electrodes are clocked to a voltage $V_\phi$ and the other electrodes are held at a dc potential $V_{dc}$. The potential profiles under the clocked electrode and the dc electrode are shown in FIG. 2*a*, which illustrates the transfer mechanism. The voltage difference $\Delta V = V_\phi - V_{dc}$ is applied to the resistor consisting of the P+ layer 165 between the mesas (i.e., in the inter-electrode region). The length of the resistor is chosen to maximize the velocity in the interelectrode transfer region. The maximum velocity therefore maximizes the current flow which is given by J=qvn, where v is the carrier velocity, q is the electronic charge and n is the carrier density. To optimize the transfer efficiency, it is necessary to maximize the current flow. This is achieved with the maximum value of v and the maximum value of n. The maximum value of v is obtained as just discussed and the maximum value of n is obtained by the implanted N+ region between electrodes as discussed above.

The scheme just discussed is a 1½ phase clocking scheme. As is well known in Si technology, there are many possible clocking schemes and these may also be implemented here. These include a) a three phase clocking scheme wherein the pixels are grouped into sets of three ordered pixels, the first pixel in each set is clocked with a phase I clock, the second pixel in each set is clocked with a phase II clock and the third pixel in each set is clocked with a phase III clock, b) a fully two phase clocking scheme wherein every other pixel is clocked with a phase I clock and the remaining pixels are clocked with a phase II clock, and c) a uni-phase clocking scheme. The uni-phase clocking scheme is usually referred to as a virtual phase CCD and is achieved with a series of strategically placed p and n implants. The uni-phase operation has been exploited successfully in Si CCD's which use a buried electron channel to store the charge. The surface of the buried channel is inverted by voltage to produce a hole inversion channel which clamps the potential of the electron channel. This natural clamping of the surface potential by the formation of a p channel eliminates the need for a separate dc electrode allowing a single electrode to be used. The voltage at which this clamping occurs is controlled locally with a p type implant. All of these clocking schemes are applicable to the Inversion Channel GaAs CCD.

Figure 3:
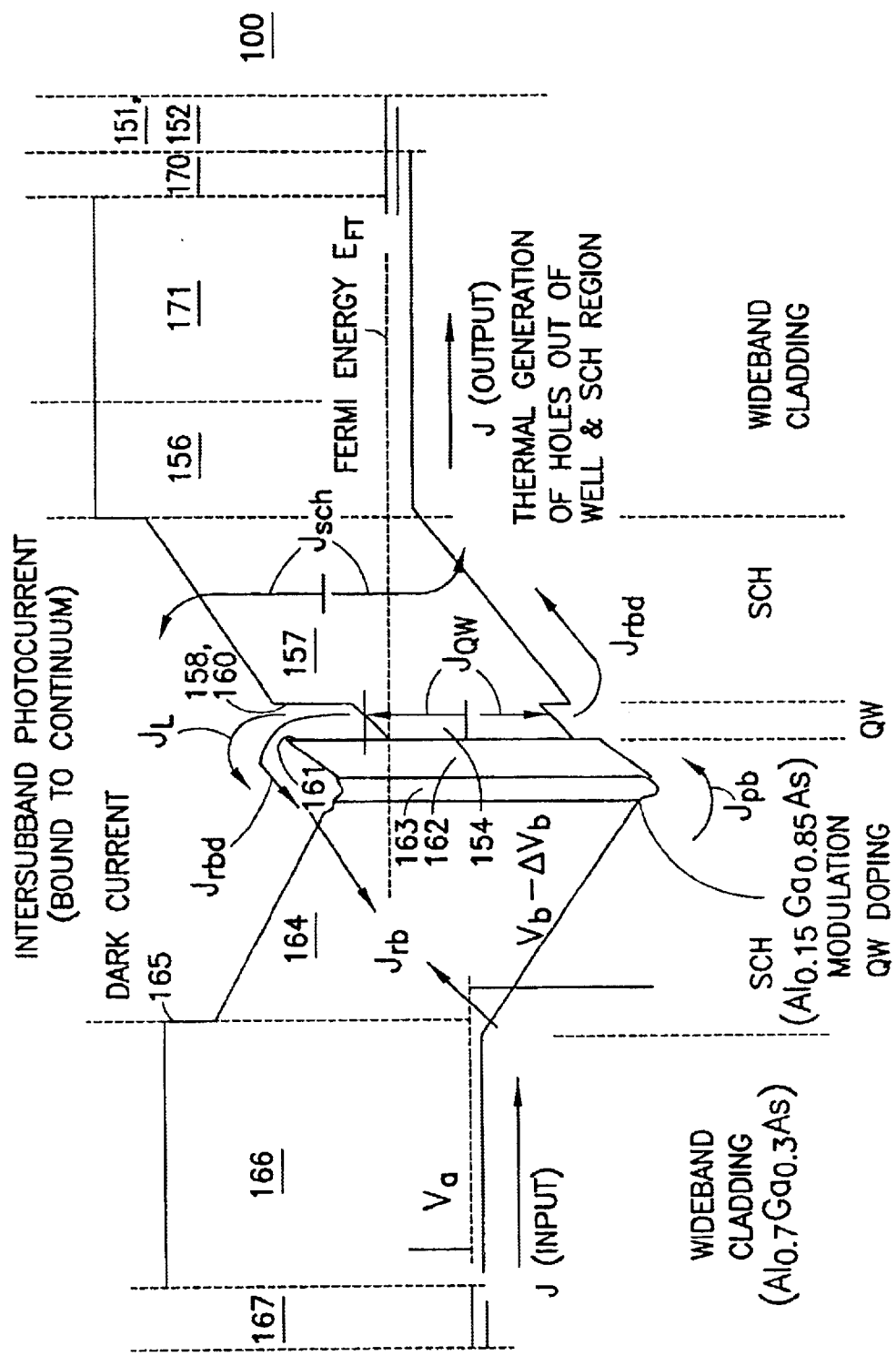
FIG. 3 is an energy diagram cross-section in the vertical direction through a storage pixel in the illuminated condition showing all of the significant current flows from the contacts and into and out of the well.

The CCD described above has the unique capability of detecting an input signal in the spectral range from about 3 µm to 20 µm by the mechanism of intersubband absorption. The energy band diagram of the device is shown in FIG. 3. It shows the quantum well and the current flows of charge carriers which may either fill the well or empty the well. The current flows into the well are the thermal emission from the modulation doped layer 163 to the left of the well, and the generation currents flowing toward the well(s) from the collector depletion layer consisting of the layers 170, 171, 156, and 157 and from the quantum well(s) and barrier(s) which are layers 159 and 160 respectively. The currents flowing out of the well are the thermal emission current from the quantum well into the modulation doped layer 163 and the photocurrent from the quantum well into the modulation doped layer produced by the intersubband absorption in the quantum well. The other important current flow is the recombination current Jrb which allows electrons to flow from the modulation doped layer to the emitter contact (metal gate electrode 120) via electron-hole recombination current in the capacitor layer 164. During the operation as a photodetector, the gate electrode 120 is forward biased with respect to the collector contact layer 170/collector electrode 170A. This means that the capacitor layer 164 is forward biased and the collector contact layer 170 is reverse biased which enables the photocurrent to be conducted out of the system by forward bias and the dark current current flow (Jrbd) in the system to be controlled by the reverse bias across the collector contact layer 170. The operation of the photodetector is described as follows. The quantum well is initially filled substantially in the absence of light. A reasonable design is that the Fermi energy is above the first subband in the quantum well. Then the absorption will be maximized because it is proportional to the number of electrons in the initial state. When long wavelength light is incident, then the photocurrent empties the quantum well. The dark current flowing into the well is produced by the generation current which is produced by emission across the energy gap of the quantum well or the barrier regions. The noise current $i_n$ in the device which represents the limit to the detectable power is specified by the dark current $I_d$ and it is $i_n^2 = 2qI_dB$ where q is the electronic charge and B is the bandwidth. In a conventional QWIP device, the dark current flows over a small barrier of a size comparable to the quantum well and therefore to obtain high background limited operation, it is necessary to cool the device to cryogenic temperatures of 50–60K in order to reduce $I_d$. Only at these temperatures can the shot noise associated with the dark current be reduced to a level that is comparable to the noise associated with the black body radiation from the scene at a temperature of 300K.

The structure illustrated in FIGS. 1–3 has a fundamental advantage in reducing the dark current flow even at temperatures up to and above 300K. The reason is that the barrier to the generation of dark current and the barrier to the optical emission from the quantum well are distinctly different. As the diagram shows, the dark current is produced by the thermal emission across the energy gap of either the quantum well (corresponding to strained InGaAs with a bandgap of about 1.24 eV), the barrier region (corresponding to GaAs with a bandgap of 1.42 eV), and the depletion regions (corresponding to $Al_{x2}Ga_{y2}As$ with a bandgap of 1.65 eV). Generally speaking the depletion regions become the main source of dark current. In contrast to the dark current barrier, the optical emission barrier is the energy interval between the first subband in the quantum well and the top of the well (this is basically the depth of the quantum well). Because this structure has decoupled the dark current generation barrier from the optical emission barrier, then it is possible to operate at room temperature and still achieve BLIP operation. Therefore we may realize all of the benefits of high resolution and high speed photovoltaic sensing offered by the QWIP detection mechanism with an uncooled semiconductor chip.

The infrared detection mechanism described above has been described as an integral part of an efficient CCD structure in GaAs. However the detector could equally as well be incorporated into the photo-sensitive portion of an active pixel structure. In the active pixel, the charge is transferred across one barrier to a bit line which connects to the sense amplifier. The charge transfer mechanisms are identical to those of the CCD, but the charge transfer efficiency is much less of an issue because there is only one transfer gate separating the storage area from the sensing node. The tradeoff is that the fill factor of the active pixel is less than the CCD because more circuitry is required. Therefore the operation of the intersubband detector is identical in the CCD and active pixel architectures.

Figure 4:
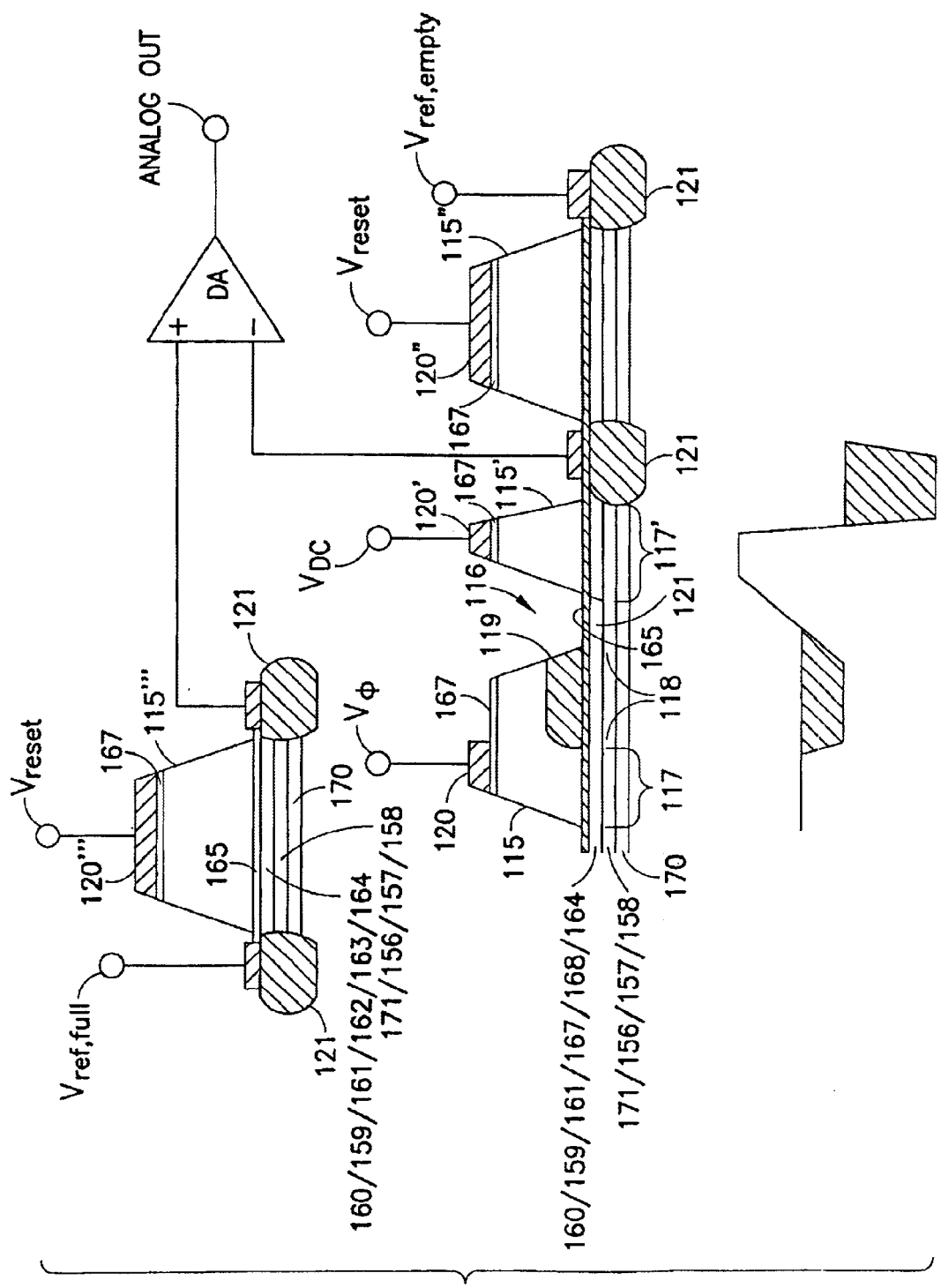
FIG. 4 is a schematic drawing of the last pixel element in the CCD and its connection by way of a separate clocked output gate to the output differential amplifier by way of a floating diffusion node which is reset each clock cycle. For the active pixel architecture, Vφ is the single pixel element connected to the output amplifier stage.

In both the CCD and the active pixel devices, the signal of interest is actually the the charge that is removed from the well. For very weak optical input signals, very little charge is removed and for very strong optical inputs the well is essentially emptied at the end of the imaging cycle. The situation is ideal for the elimination of noise in the detection process because it requires differential operation to obtain the actual output signal. For example, if the output of the imaged pixel is input to one side of a differential amplifier, then it is appropriate to input a signal to the other side of the DA from a full well to perform as a reference level. These connections are illustrated in FIG. 4 which shows a storage gate Vφ (115), a transfer gate $V_{dc}$ (115'), two a reset gates Vreset (115",115'''), a differential amplifier (DA) and two reference nodes, one for a full well ($V_{ref,full}$) and one for an empty well ($V_{ref,empty}$). This situation is identical to that used in the correlated double sampling scheme in advanced CCD read-out circuits to reduce set:reset noise. There are several noise mechanisms contributing noise to the amplifier inputs which include clocking noise, kTC noise on the reset transistor, and shot noise on the dark current to mention a few. All of the noise mechanisms that are common to the read-out of the cell with and without data, are reduced by the common mode rejection ratio of the differential amplifier. Therefore the intersubband detection within the inversion channel has a fundamental advantage because the differential process is essential to recover the signal, and yet at the same time, it performs the role of reducing many noise mechanisms according to the differential rejection of common mode signals.

In accordance with the present invention, a semiconductor imaging device is provided that is comprised of the following layer structure;

a distributed bragg reflector mirror epitaxially grown upon a semiinsulating GaAs substrate;

a first layer P+ GaAs deposited on said epitaxial mirror;

a layer of P+ type aluminum gallium arsenide (70% Al) disposed on said layer of GaAs;

a layer of P type aluminum gallium arsenide (70% Al) disposed on said layer of P+ type aluminum gallium arsenide;

a Pseudomorphic High Electron Mobility Transistor (PHEMT) transistor epitaxial layer structure without a schottky contact and using N type modulation doping, disposed on said layer of P type aluminum gallium arsenide, said PHEMT epitaxial layer structure comprising a layer of aluminum gallium arsenide (15% Al), a layer of GaAs, one to three quantum wells of strained InGaAs separated by GaAs barriers, a spacer layer of aluminum gallium arsenide (15% Al), a modulation doped layer of aluminum gallium arsenide (15% Al) and a gate spacer layer of aluminum gallium arsenide (15% Al);

a planar doped layer of P+ type aluminum gallium arsenide (15% Al) disposed on said PHEMT epitaxial layer structure;

a cladding layer of aluminum gallium arsenide (70% Al) of modest P type doping disposed on said planar doped layer; and a layer of GaAs of P++ type doping disposed on said cladding layer.

In addition, a charge coupled device (CCD) may be realized with the epitaxial growth structure summarized above. The CCD comprises a linear array of mesas in which charge may be stored and transferred from one mesa to the next by a suitable arrangement of clock pulses applied to said mesas, said linear array being terminated in a charge sensitive amplifier for the purposes of detection of said stored charge when transferred to said amplifier, said mesas being adjacent to each other and separated by transfer regions which have been etched from the original surface to the top of a lower P+ planar-doped layer, said transfer regions being implanted with N+ type doping to form a low resistance path between said mesas thereby enabling high efficiency transfer; each pixel being comprised of a barrier section and a storage section, said barrier section being defined by a refractory metal top electrode which results in an enhancement transistor threshold in said barrier regions, and said barrier region being connected electrically by an uppermost p+ charge sheet to said storage region to maintain an equipotential across said mesa, said storage region forming an optical aperture with no metal top contact and being shifted electrically in threshold by an ion implant resulting in a depletion transistor in said storage region, said storage region being contained in a vertical optical cavity, said cavity being terminated in the vertical direction on its top surface by a deposited DBR mirror and on its bottom by a grown epitaxial mirror so that resonant absorption may occur in said cavity formed by said mirrors for light admitted to the structure from either the top or the bottom of said cavity.

A single pixel may be associated with each output charge detection and amplification stage. This configuration, defined as an active pixel structure, having the advantage over a CCD of a minimum loss corresponding to a single transfer to an dedicated output charge sensitive amplifier to that pixel and having the disadvantage of a larger area per pixel resulting from said dedicated amplifier.

Every other pixel of the CCD may be biased to a constant voltage and the remaining pixels are clocked with a single phase clock pulse to produce 1½ phase-operation.

Alternately, every other pixel may be clocked with a phase I clock and the remaining pixels are clocked with a phase II clock to produce 2 phase operation.

In another configuration, the pixels are grouped into sets of three ordered pixels, and the first pixel in each set is clocked with a phase I clock, the second pixel in each set is clocked with a phase II clock and the third pixel in each set is clocked with a phase III clock to produce 3 phase operation.

The CCD may have implants placed strategically to obtain uniphase operation.

The CCD may operate as follows: the quantum well absorbs input radiation by an intersubband absorption mechanism and wherein said absorption is enhanced by the resonance of a cavity containing said storage region, said input radiation causing electrons residing in a substantially populated well to be emitted from a bound quantum well state into a quasi-bound state at the top of said quantum well or into a continuum of states energetically above said quantum well and to be conducted by thermionic emission, drift and diffusion processes into a gate capacitor section positioned immediately above said quantum well, said emitted electrons producing a deficiency of electrons in said quantum well, said deficiency representing a disturbance from thermal equilibrium which can only be restored by the addition of electrons to said well via the thermal generation of electrons across the bandgap of the host material which is large enough to inhibit dark current flow to such small levels that background limited operation may be obtained in the temperature region around room temperature thereby eliminating the need for cryogenic cooling procedures, said deficiency of charge being detected at a charge amplifier output stage of a CCD array or of a single active pixel stage, said amplifier stage consisting of a floating gate correlated CCD double sampler or a floating diffusion output node with a reset gate capability with the output in either case connected to a differential amplifier such that the electronic output signal from said amplifier represents the difference between a full well of charge and the amount of charge actually transferred from said imaged pixel, said difference signal being reduced in noise content compared to the noise existing on said actual pixel charge.

In accordance with the present invention, a photon detector is realized by using the intersubband absorption mechanism in a modulation doped quantum well(s). The modulation doping creates a very high electric field in the well which enables absorption of input TE polarized light and also conducts the carriers emitted from the well into the modulation doped layer from where they may recombine with carriers from the gate contact. Carriers are resupplied to the well by the generation of electrons across the energy gap of the quantum well material. The absorption is enhanced by the use of a resonant cavity in which the quantum well(s) are placed. The absorption and emission from the well creates a deficiency of charge in the quantum well proportional to the intensity of the input photon signal. The quantity of charge in the quantum well of each detector is converted to an output voltage by transferring the charge to the gate of an output amplifier. The detectors are arranged in the form of a 2D array with an output amplifier associated with the entire array or a row of the array as in the known charge coupled devices, or a separate amplifier could be dedicated to each pixel as in the known architecture of the active pixel device. This detector has the unique advantage of near room temperature operation because the dark current is limited to the generation across the semiconductor bandgap and not the emission over the quantum well barrier. The detector also has the advantage that the readout circuitry is implemented monolithically by the HFETs formed in the GaAs substrate simultaneously, with the detecting elements.

What is claimed is:

1. A semiconductor imaging device, comprising:
   a) a semiinsulating gallium arsenide (GaAs) substrate;
   b) a distributed Bragg reflector mirror epitaxially grown on said semiinsulating GaAs substrate;
   c) a first layer of P+ type GaAs deposited on said distributed Bragg reflector mirror for contacting a collector electrode;
   d) at least one layer of aluminum gallium arsenide (AlGaAs) disposed on said first layer of P+ type GaAs;
   e) an epitaxial layer structure of at least one quantum well of InGaAs having GaAs layers on each either side;
   f) a first spacer layer of AlGaAs disposed on said epitaxial layer structure;
   g) an N type modulation doped layer of AlGaAs disposed on said first spacer layer;
   h) a second spacer layer of AlGaAs disposed on said modulation doped layer;
   i) a planar doped layer of P+ type AlGaAs disposed on said second spacer layer;
   j) a cladding layer of AlGaAs of modest P type doping disposed on said planar doped layer; and
   k) a layer of GaAs of P++ type doping disposed on said cladding layer for contacting a gate electrode,
       wherein a forward bias is applied to said gate electrode with respect to said collector electrode such that light incident on said semiconductor imaging device causes charge to leave said at least one quantum well.

2. A semiconductor imaging device according to claim 1, wherein:
   said at least one quantum well comprises two or three quantum wells, adjacent of said two or three quantum wells being separated by a GaAs layer.

3. A semiconductor imaging device according to claim 1, wherein:
   said at least one layer of aluminum gallium arsenide (AlGaAs) comprises a P type AlGaAs layer disposed on said first layer of P+ type GaAs and a first layer of undoped AlGaAs disposed on said P type AlGaAs layer.

4. A semiconductor imaging device according to claim 3, wherein:
   said at least one layer of aluminum gallium arsenide further comprises a second layer of undoped AlGaAs disposed on said first layer of undoped AlGaAs, said first layer of undoped AlGaAs having a first aluminum content, and said second layer of undoped AlGaAs having a second aluminum content smaller than said first aluminum content.

5. A semiconductor imaging device according to claim 4, wherein:
   said first aluminum content is greater than 40% and less than 100%, and said second aluminum content is greater than 10% and less than 30%.

6. A semiconductor imaging device according to claim 5, wherein:
   said first aluminum content is approximately 70% and said second aluminum content is approximately 15%.

7. A semiconductor imaging device according to claim 5, further comprising:
   a refractory metal disposed on a portion of said layer of GaAs of P++ type doping, said refractory metal adapted to receive a voltage.

8. A semiconductor imaging device according to claim 1, wherein:
   said semiconductor imaging device is arranged as a pixel with elements j) and k) constituting a mesa extending a first horizontal distance, and elements a) through i) extending a second horizontal distance larger than said first horizontal distance.

9. A semiconductor imaging device according to claim 8, further comprising:

a refractory metal disposed on a portion of said mesa layer of GaAs of P++ type doping, said refractory metal adapted to receive a voltage.

10. A semiconductor imaging device according to claim 1, wherein:

said semiconductor imaging device is arranged as a plurality of pixels, each of said plurality of pixels having a mesa formed from elements j) and k) and separated from an adjacent mesa by a transfer region which does not include elements j) and k) and which is implanted with N+ type doping to form a low resistance path between adjacent mesas.

11. A semiconductor imaging device according to claim 10, further comprising:

a refractory metal disposed on a portion of each said mesa atop a layer of GaAs of P++ type doping, said refractory metal adapted to receive a voltage.

12. A semiconductor imaging device according to claim 11, further comprising:

a charge sensitive amplifier coupled to one of said plurality of pixels.

13. A semiconductor imaging device according to claim 12, wherein:

said plurality of pixels comprise a linear array of pixels, said one of said plurality of pixels to which said charge sensitive amplifier is coupled being a last pixel in said linear array, and said charge sensitive amplifier and said linear array together comprise a charge coupled device wherein said plurality of pixels store charges, and wherein said charges are transferred from one pixel to another by an application of clocked voltages to said refractory metal disposed on said mesas.

14. A semiconductor imaging device according to claim 13, wherein:

said array of pixels is controlled by a 1½ phase clocking scheme, and every other pixel in said linear array of pixels is biased to a constant voltage, and the remaining pixels are clocked with a single phase clock.

15. A semiconductor imaging device according to claim 11, further comprising:

a plurality of charge sensitive amplifiers respectively coupled to individuals of said plurality of pixels to generate a plurality of analog signals corresponding to charge that leaves said plurality of pixels during an imaging cycle.

16. A semiconductor imaging device according to claim 11, wherein:

each pixel includes a barrier region disposed under said refractory metal and a storage region adjacent said barrier region, said storage region including N-type dopant implanted into at least elements (e) through (i).

17. A semiconductor imaging device, comprising:

a plurality of pixels formed from a multilayer sandwich including a substrate, a collector ohmic contact layer disposed above said substrate, a gate ohmic contact layer disposed above said substrate, at least one modulation doped quantum well heterostructure disposed above said substrate between said collector ohmic contact layer and said gate ohmic contact layer, wherein said modulation doped quantum well heterostructure includes at least one quantum well structure, a modulation doped layer and an undoped spacer layer disposed between said at least one quantum well structure and said modulation doped layer;

an undoped spacer layer, a charge source layer, and a cladding layer disposed above said substrate between said modulation doped quantum well heterostructure and said gate ohmic contact layer;

each pixel including a gate metal layer formed on a portion of said gate ohmic contact layer for said pixel, a barrier region disposed under said gate metal layer, a storage region adjacent said barrier region, said storage region including dopant implanted into portions of said multilayer sandwich between said charge source layer and said modulation doped quantum well heterostructure.

18. A semiconductor imaging device according to claim 17, wherein a forward bias is applied to said gate metal layer electrode with respect to said collector contact layer for a given pixel such that incident light causes charge to leave said modulation doped quantum well heterostructure of the given pixel.

19. A semiconductor imaging device according to claim 17, wherein:

said multilayer sandwich is substantially formed from group III–V materials.

20. A semiconductor imaging device according to claim 17, wherein:

transfer regions, each disposed between a pixel pair and formed from said multilayer sandwich with the gate ohmic contact layer and cladding layer removed, and which is implanted with dopant to form a low resistance path between adjacent pixels.

21. A semiconductor imaging device according to claim 20, wherein:

said plurality of pixels score charges that are transferred from one pixel to another via said transfer regions by an application of clocked voltages to said gate metal layers of said pixels.

22. A semiconductor imaging device according to claim 21, wherein:

said plurality of pixels are logically arranged in a linear row that includes a last pixel, and a charge sensitive amplifier is coupled to said last pixel to generate an analog signal corresponding to charge supplied thereto.

23. A semiconductor imaging device according to claim 17, wherein:

said modulation doped quantum well heterostructure comprises at least one undoped quantum well structure designed for intersubband absorption.

24. A semiconductor imaging device according to claim 23, wherein:

said modulation doped quantum well heterostructure comprises a modulation doped layer of N+ type material.

25. A semiconductor imaging device of according to claim 24, wherein:

said charge source layer comprises a thin layer of P+ type material.

26. A semiconductor imaging device of according to claim 24, wherein:

said cladding layer comprises a layer of P type material.

* * * * *